United States Patent [19]

Aoyama et al.

[11] 4,200,969
[45] May 6, 1980

[54] SEMICONDUCTOR DEVICE WITH MULTI-LAYERED METALIZATIONS

[75] Inventors: Masaharu Aoyama; Shunichi Hiraki, both of Yokohama; Toshio Yonezawa, Yokosuka, all of Japan

[73] Assignee: Tokyo Shibaura Electric Co., Ltd., Japan

[21] Appl. No.: 831,873

[22] Filed: Sep. 9, 1977

[30] Foreign Application Priority Data

Sep. 10, 1976 [JP] Japan .................................. 51/107888

[51] Int. Cl.² ............................................. B01J 17/00
[52] U.S. Cl. ................................... 29/577 R; 29/578; 29/591; 29/847; 156/656
[58] Field of Search ...................... 357/71, 68; 29/577, 29/580, 578, 591, 628; 156/656, 657

[56] References Cited

U.S. PATENT DOCUMENTS

| | | | |
|---|---|---|---|
| 3,586,922 | 6/1971 | Johnson | 357/68 |
| 3,607,480 | 9/1971 | Harrap | 156/657 |
| 3,900,944 | 8/1975 | Fuller | 29/580 |
| 3,935,083 | 1/1976 | Tomozawa | 156/656 |
| 3,991,231 | 11/1976 | Trausch | 156/656 |

Primary Examiner—W. C. Tupman
Attorney, Agent, or Firm—Finnegan, Henderson, Farabow, Garrett & Dunner

[57] ABSTRACT

There are provided a semiconductor device having alternately layered insulating and conductive layers on the major surface of a semiconductor body and the process for manufacturing the semiconductor device. In the manufacturing process, the conductive layers other than the conductive layer finally formed are each formed to be a laminate including at least two metal layers of which the etching rates are different. The photo-engraving process follows this step. In the lamina, the metal layer closer to the semiconductor body has a lower etching rate than that of the metal layer formed thereover. In the semiconductor device, the conductive layer other than that disposed furthest away from the semiconductor body has its side wall diverged to widen toward the semiconductor body.

12 Claims, 26 Drawing Figures

SEMICONDUCTOR DEVICE WITH MULTI-LAYERED METALIZATIONS

The present invention relates to a semiconductor device with multi-layered metalizations and a process for manufacturing the semiconductor device.

Generally, in the integrated circuits, a number of components in the semiconductor body are interconnected by a metalization over the major surface of the semiconductor body. In the integrated circuits including a large number of components, the interconnection thereamong is considerably complex. When a single layer of metalization is used for the interconnection in such integrated circuits, a considerably large area is required, resulting in reduction of the integration density of the integrated circuit.

For this reason, multi-layered metalizations have been employed recently for the interconnection, in place of the conventional single layer metalization. In the multi-layered metalization scheme, insulating and conductive layers are alternately and successively layered on the major surface of the semiconductor body. Each insulating layer has contact holes or openings through which the conductive layers disposed on both sides of the insulating layer are in contact with each other. In this case, if the insulating layer has overhanging portions, the conductive layer of metalization layered thereover may fail to have a uniform thickness over the entire insulating layer. This presents some problems: the conductive layer layered thereover is sometimes discontinuous, i.e. disconnected at the overhanging portion, or otherwise it is possibly disconnected thereat during the use of the circuit. The conventional semiconductor device of such a type has such a harmful overhanging portion of the insulating layer. Accordingly, the conventional one suffers from the just-mentioned problems.

Figure 1:
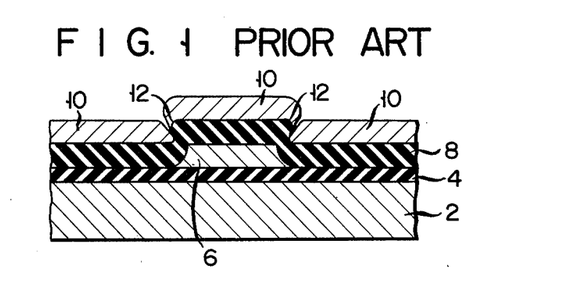
FIG. 1 shows a cross sectional view of a part of a conventional semiconductor device with multi-layered metalizations.

For clear understanding of the conventional semiconductor device of this type, reference is made to FIG. 1. In the figure, reference numerals 2, 4, 6, 8 and 10 designate a semiconductor body, a first insulating layer, a first conductive layer of aluminum, for example, a second insulating layer, and a second conductive layer of aluminum, for example, respectively. As seen from the figure, the second insulating layer 8 overhangs at the portions indicated as 12. And the second conductive layer 10 is discontinuous, i.e. disconnected at the overhanging portions.

Figure 2A:
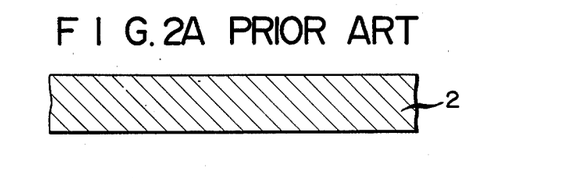
FIGS. 2A to 2H show a process for manufacturing the semiconductor device shown in FIG. 1.
Figure 2B:
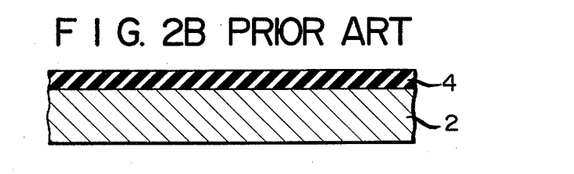
Figure 2C:
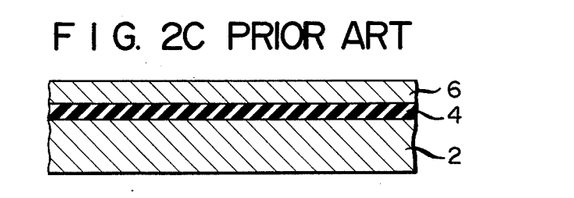
Figure 2D:
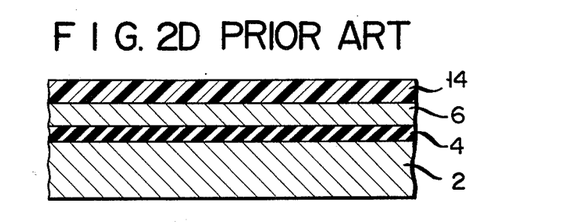
Figures 2E, 2F:
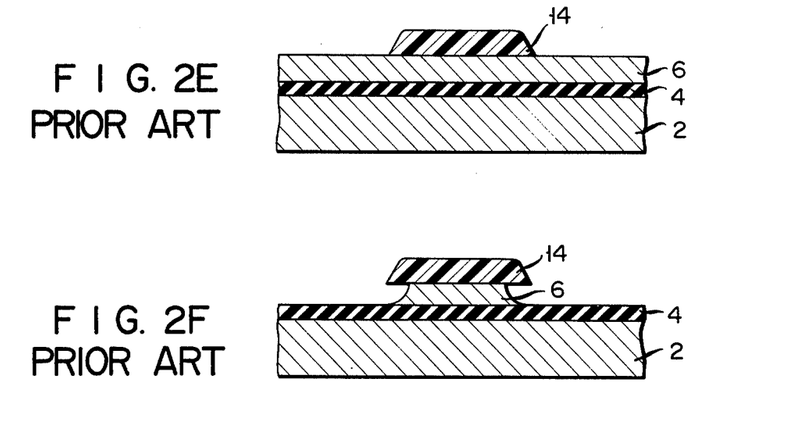
Figure 2G:
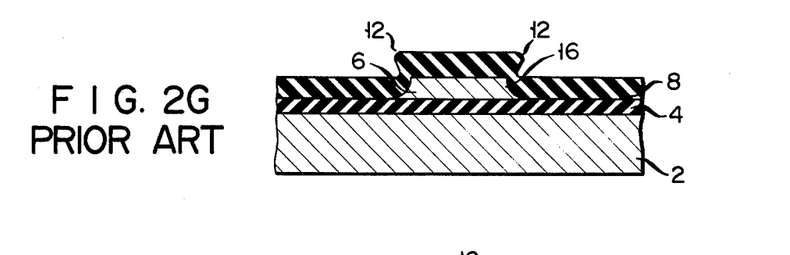
Figure 2H:
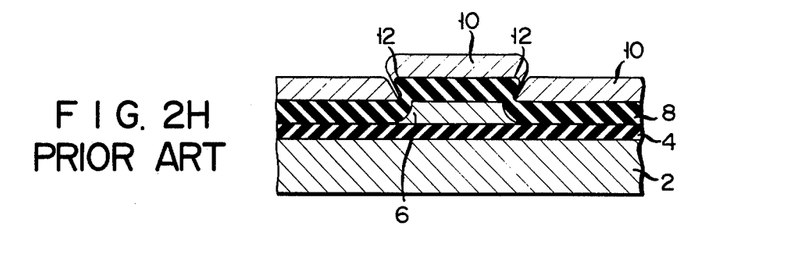

One form of the processes for fabricating the semiconductor device shown in FIG. 1 will be described with reference to FIGS. 2A through 2H. A semiconductor body 2 made of silicon, for example, is first prepared in which a number of components (not shown) are formed, as shown in FIG. 2A. Then, the first insulating layer 4 e.g. an $SiO_2$ film, is formed over the semiconductor body 2 by, for example, the surface oxidation treatment, as shown in FIG. 2B. After this, the first conductive layer 6, e.g. an aluminum film, is deposited on the first insulating layer 4 by any suitable process, such as by evaporation method, as shown in FIG. 2C. At the next step, the aluminum layer 6 is coated with a thin uniform coating of photoresistive material to form a photoresist 14, as shown in FIG. 2D. The photoresist 14 is then patterned to have a predetermined pattern of it. The patterned photoresist is used as a mask when the aluminum layer 6 is etched. This step is shown in FIG. 2E. After the patterning of the photoresist, the aluminum 6 is etched through the mask of the photoresist 14 to remove the aluminum layer except the portion thereof under the mask 14. See FIG. 2F. Subsequently, the mask 14 is removed and the second insulating layer 8 is formed by, for example, chemical vapour deposition method, as shown in FIG. 2G. As seen from FIG. 2G, the second insulating layer 8 is overhanged at the portions designated as 12. The overhangs follow from the fact that the side wall 16 of the aluminum layer 6 is steeply slanted. After this, the second conductive layer 10, i.e. an aluminum layer is deposited on the second insulation layer 8 by vaporizing aluminum, as shown in FIG. 2H. Note here that the aluminum layer 10 is discontinuous, i.e. disconnected, at the overhanging portions 12. The aluminum layer 10 must be continuous without any disconnection. Further, it must be as thin as possible for some reasons: as the layer is thicker, the time to form the layer is longer; and the time to etch the layer 10 for obtaining a desired wiring pattern is longer, too. That is, from a working viewpoint, the efficiency is deteriorated. Moreover, the precision of the wiring pattern obtained is possibly reduced.

Through effort to overcome these difficulties, the inventors of the present invention found the following facts. At least two metal layers of which the etching rates are different are used for the conductive layer. In this case, these metal layers are layered in such a manner that the metal layer with the highest etching rate is disposed at the top side furthest away from the semiconductor body and that with the lowest etching rate is disposed at the bottom side closer to the semiconductor body. The conductive layers are then etched through a mask with a predetermined pattern by using suitable solution. As a result of the etching, the side surfaces of the remaining portions are diverged to widen toward the semiconductor body, thereby being accompanied by none of the harmful overhanging portions of the insulating layer. Therefore, the aluminum layer 10 to be layered over the insulating layer may be layered without any disconnection. The inclination angle of the side wall of the remaining portion to a major surface of the semiconductor body is changeable depending on the kind of the metal layers of the conductive layer and the kind of the etching solution.

Accordingly, an object of the present invention is to provide a semiconductor device with multi-layered metalizations eliminating the overhanging portions of the insulating layer and thereby suffering no disconnection of the conductive layer.

Another object of the present invention is to provide a process for fabricating the above semiconductor device.

According to one aspect of the present invention, there is provided a semiconductor device with multi-layered metalizations comprising: a semiconductor body; alternately layered insulating and conductive layers formed on the major surface of the semiconductor body the insulating layers each having contacting holes arranged in a predetermined pattern and the conductive layers each having a predetermined pattern; each of the conductive layers including at least one metal layer; and the conductive layer or layers other than that furthest away from the semiconductor body having side walls diverged to widen toward the semiconductor body.

According to another aspect of the present invention, there is provided a process for fabricating a semiconductor device with multi-layered metalizations comprising the steps of: preparing a semiconductor body; forming on a major surface of the semiconductor body a first insulating layer with first contact holes arranged in a predetermined pattern; forming a first conductive layer of metal on the first insulating layer, the first conductive layer including at least two metal layers laminated to each other and contacting the major surface of the semiconductor body through the first contact holes, one of the metal layers of the first conductive layer which contact the first insulating layer having a lower etching rate than has the other metal layer; forming a mask layer with a predetermined pattern on the first conductive layer; etching the first conductive layer by using the mask layer as a mask to remove unnecessary portion thereof so that the side surface of the remaining portion of the conductive layer is diverged to widen toward the semiconductor body; removing the mask layer; forming on the first conductive layer a second insulating layer with second contact holes arranged in a predetermined pattern; forming a second conductive layer including at least one metal layer on the second insulating layer, the second conductive layer contacting with the first conductive layer through the second contact holes.

Other objects and features of the present invention will be apparent from the following description taken in connection with the accompanying drawings, in which.

Figure 3:
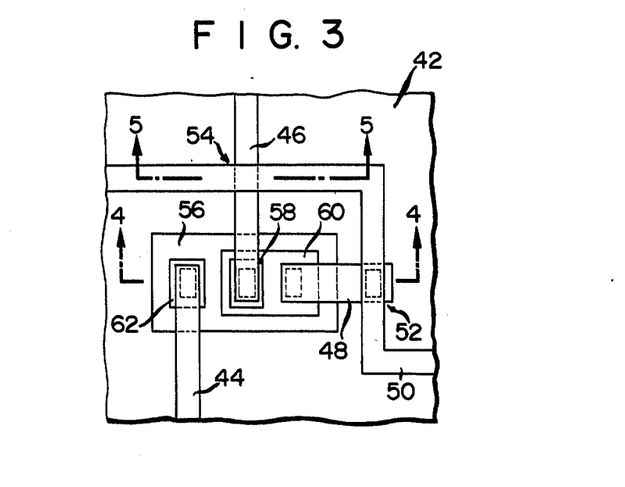
FIG. 3 shows a partial plan view of a first embodiment of a semiconductor device with multi-layered metalizations according to the present invention.

Referring now to FIG. 3, there is shown a semiconductor device with multi-layered metalizations which is an embodiment of the present invention. In the embodiment, the present invention is applied to a semiconductor body 42 having a single transistor, for example. Reference numerals 44, 46, 48 represent lower conductive layers and numeral 50 denotes an upper conductive layer. The upper conductive layer 50 is formed over the conductive layers 44, 46 and 48 made of, for example, aluminum with an insulating layer therebetween. The upper conductive layer 50 comes in contact with one of the lower conductive layers, illustrated as 48, through a contacting hole of the insulating layer. The contacting portion is indicated by reference numeral 52. At a cross point 54, the upper conductive layer 50 and another lower conductive layer 46 are out of contact with each other but just cross with the insulating layer.

The FIG. 3 embodiment will be described with reference to FIG. 4. A single transistor including a collector region 56, an emitter region 58 and a base region 60 is fabricated in the semiconductor body 42. In the figure, the conductivity of each region is not illustrated, since it is not critical to the present invention. Although only a single transistor is depicted in the drawing of the figure, a number of transistors are usually fabricated in the semiconductive body 42, and other various components as well are likewise incorporated in the same. A region 62 is a collector region with a high impurity concentration for ohmic contact. A first insulating layer 64, for example, an $SiO_2$ film, is formed on the major surface of the semiconductor body 42. Contacting holes 65a to 65c are arranged in a predetermined pattern in the first insulating layer 64. Lower conductive layers 44, 46 and 48 are formed on the insulating layer 64. The lower conductive layers 44, 46 and 48 are in contact with the collector region 62, the emitter region 58 and the base region 60 through contacting holes 64a to 64c, respectively. The side wall of each conductive layers 44, 46 and 48 gently and outwardly slants toward the semiconductor body 42. A second insulating layer 66 having a plurality of contact holes arranged in a predetermined pattern (although a single contacting hole designated as 67 is shown in the figure), is formed on the lower conductive layers 44, 46 and 48. The upper metal layer 50 formed on the second insulating layer 66 contacts the lower conductive layer 48, through the contacting hole 67 of the second insulating layer 66. The lower conductive layers 44, 46 and 48 are used as a collector electrode, an emitter electrode and a base electrode, respectively. The upper conductive layer 50 is also used as a base electrode.

As described above, in the semiconductor device, the side wall of each lower conductive layers 44, 46 and 48 is so diverged as to gradually widen toward the semiconductor body 42. Accordingly, there is eliminated the disadvantage of the conventional semiconductor device that the second insulating layer 66 overhangs the lower conductive layers 44, 46 and 48. That is, according to the present invention, the second insulating layer 66 is layered uniformly over the lower conductive layers 44, 46 and 48, thereby eliminating the disconnection of the upper conductive layer 50. See FIGS. 4 and 5. FIG. 5 also shows that the upper conductive layer 50 crosses the lower conductive layer 46 with insertion of the second insulating layer 66 therebetween.

Figure 5:
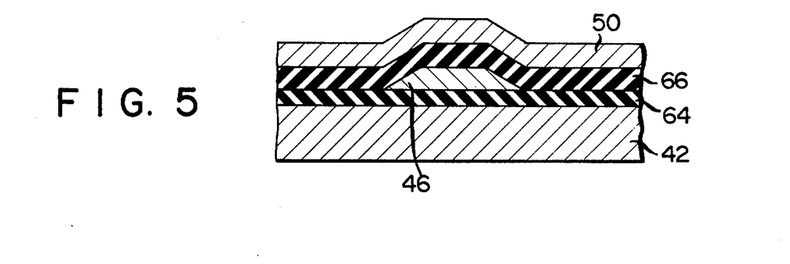
FIG. 5 shows an enlarged cross sectional view of the device shown in FIG. 3, taken along line 5—5.
Figure 6:
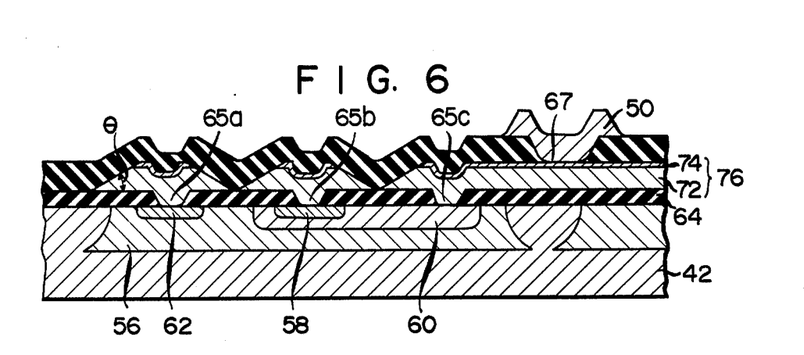
FIG. 6 shows a partial cross sectional view of another embodiment of the semiconductor device with multi-layered metalizations according to the present invention.

Turning now to FIG. 6, there is shown another embodiment of the semiconductor device with multi-layered metalizations according to the present invention. In this embodiment, the lower conductive layers 44, 46 and 48 are each comprised of a laminate 76 including two layers 72 and 74 having different etching rates. As shown, the laminate 76 includes the metal layer 72 formed on the first insulating layer 64 and another metal layer 74 superposed on the metal layer 72. The metal layer 72 is in contact with the major surface of the semiconductor body 42 through the contacting holes 65a, 65b and 65c of the first insulating layer 64. The metal layer 74 has a higher etching rate than that of the metal layer 72. In this example, the metal layer 72 is made of aluminum and the metal layer 74 made of molybdenum. It is noted that the side walls of each portion of the laminate 76 are gradually and outwardly slanted or diverged toward the semiconductor body 42, so that each side wall gradually widens toward the semiconductor body 42. As a consequence, the effect attained by this example is equal to that by the example previously stated referring to FIGS. 3 to 5.

Figure 4:
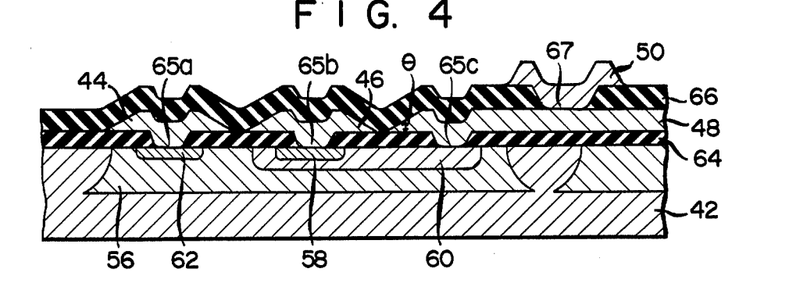
FIG. 4 shows an enlarged cross sectional view of the device shown in FIG. 3, taken along line 4—4.

The description to be made referring to FIGS. 7A to 7K is an example of the process for manufacturing the semiconductor devices with multi-layered metalizations described referring to FIGS. 3 to 5.

Figure 7A:
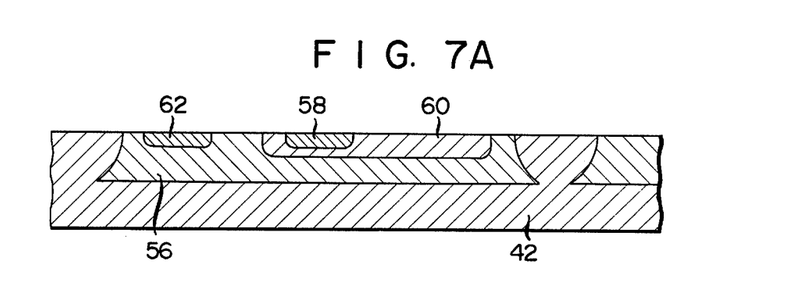
FIGS. 7A to 7K show a series of steps of a process of fabricating the semiconductor devices shown in FIGS. 3 to 5, which process is one embodiment of the present invention.
Figure 7B:
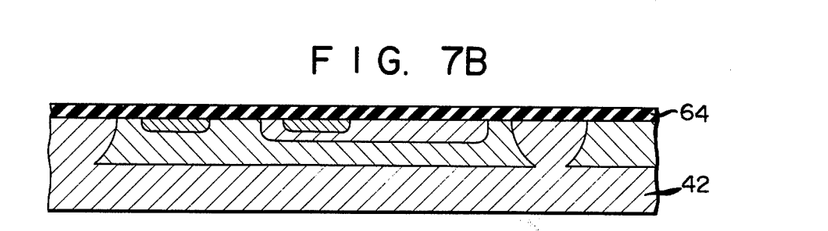
Figure 7C:
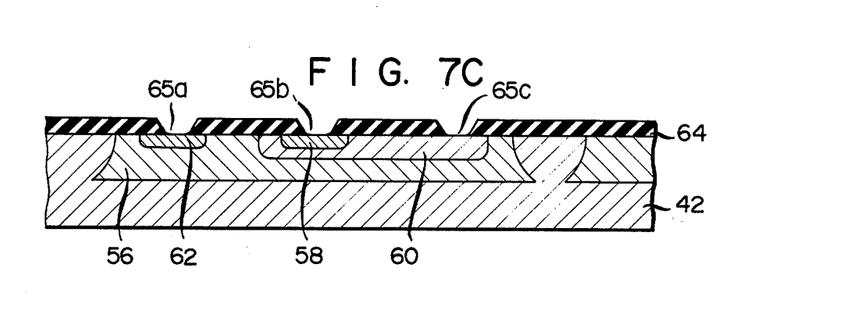
Figure 7D:
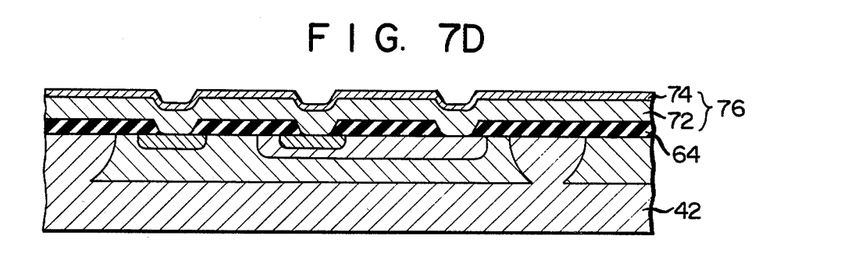
Figure 7E:
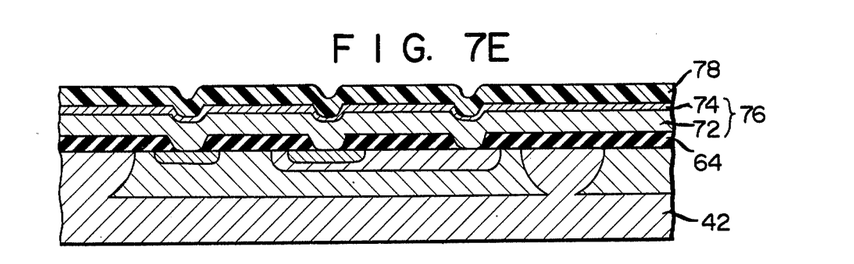
Figure 7F:
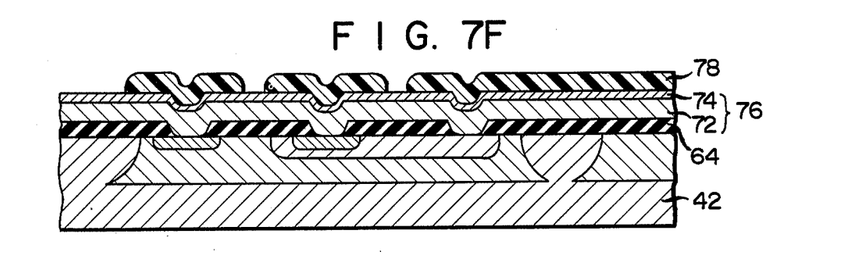
Figure 7G:
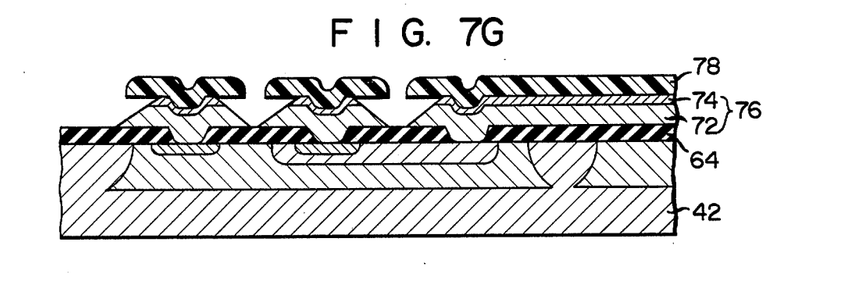
Figure 7H:
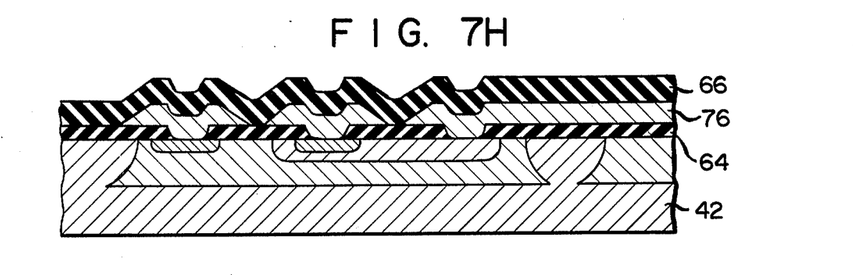
Figure 7I:
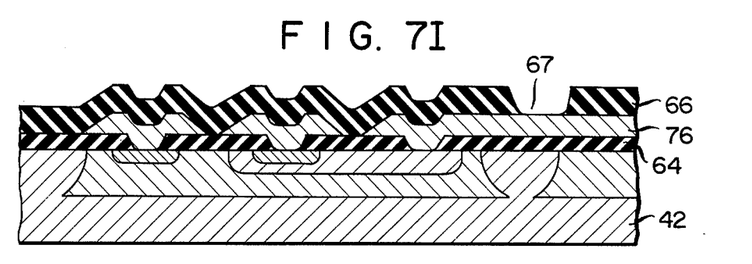
Figure 7J:
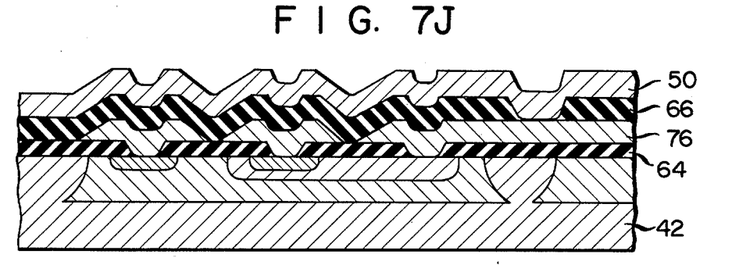
Figure 7K:
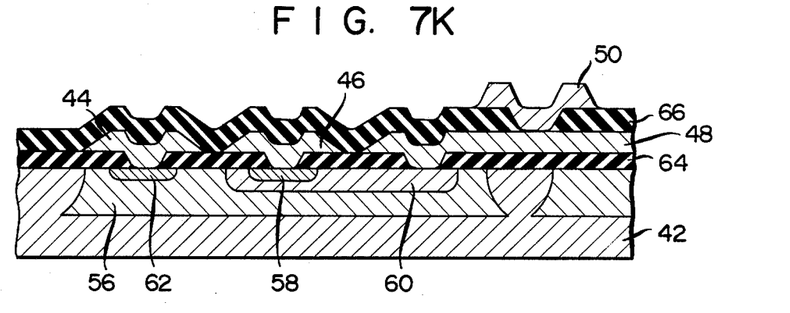

Firstly, a semiconductor body 42 made of silicon, for example, is prepared in which the necessary number of PN junctions for transistor formation is formed. See FIG. 7A. In the figure, none of symbols representing the conductivities of P and N is shown, since such is not essential to the present invention. Secondly, a first insulating layer 64 made of, for example, $SiO_2$, is formed over the major surface of the semiconductor body 42, by using, for example, the surface oxidiation treatment, as shown in FIG. 7B. Thirdly, contacting holes 65a, 65b and 65c are formed in the first insulating layer 64, with an arrangement of a predetermined pattern. The third step shown in FIG. 7C is performed by using, for example, the photo-engraving process. Fourthly, a first metal layer 72 made of, for example aluminum is formed over the first insulating layer 64, and then, a second metal layer 74 made of, for example, molybdenum is formed over the first metal layer 72 by the evaporation, spattering or the like, as shown in FIG. 7D. As described above, the etching rate of the first metal layer 72 is lower than that of the second metal layer 74. In this manner, a lamina 76 is prepared including first and second metal layers 72 and 74. Then, a predetermined wiring pattern must be formed to the laminate 76 serving as the first conductive layers. This is accompanied by photo-engraving the lamina 76. Therefore, the fifth step is to form the mask used when the laminate 76 is etched. In this step, the laminate 76 is coated thereover with photoresistive material to form a photoresist coat 78. The sixth step shown in FIG. 7F is to selectively expose the photoresist coating to ultra-violet rays and then developed to form a pattern of the photoresist 78 as shown in FIG. 7F. In the seventh step shown in FIG. 7G, the first conductive layer 76 is etched, using the patterned photoresist 78 as a mask, to form a wiring pattern of the first conductive layer as shown in FIG. 7G. In this case, preferable etching solution is composed of phosphoric acid, acetic acid, nitric acid and water when the first metal layer 72 is made of aluminum and metal layer 74 made of molybdenum. Then, the photoresist 78 is removed. In this manner, the first conductive layer 76 is photo-engraved through the fifth to seventh steps. As previously described, the etching rate of the metal layer 72 is lower than that of the metal layer 74. The amount of the metal layer 74 etched out is larger than that of the metal layer 72 for a given time. As a result, the first conductive layer 76 is delineated as shown in FIG. 7G. That is, the remaining portion of the first conductive layer 76 has its side wall, gently and outwardly slants toward the semiconductor body 42, from the upper to the lower surfaces of the conductive layer 76 to widen toward the semiconductor body 42. Then, only the metal layer 74 of the thus engraved first conductive layer 76 is removed by, for example, plasma etching method. Following the removal of the metal layer 74, a second insulating layer 66 is deposited on the first conductive layer 76 by chemical vapor deposition method, for example. This eighth step is illustrated in FIG. 7H. It is to be noted here that the second insulating layer 66 is continuously layered on the first conductive layer 76 even at the remaining portions of the first conductive layer 76, in accordance with the configuration of the layer 76, since the remaining portions of the first conductive layer 76 are gently diverged toward the semiconductor body 42 as just mentioned. In other words, such a configuration of the remaining portions of the first conductive layer 76 prevent an occurrence of the overhang of the second insulating layer 66 which is often involved in the conventional semiconductor device. The ninth step is to form a contact hole arranged in a predetermined pattern in the second insulating layer 66 by using the photo-engraving technique, as in the case of the first insulating layer 64 and the first conductive layer 76. See FIG. 7I. The tenth step is to form a second conductive layer 50 of, for example, aluminum over the second insulating layer 66, as shown in FIg. 7J, by any suitable process such as evaporation, spattering method or the like. The second conductive layer 50 contacts the first conductive layer 76 through contact holes of the second insulating layer 66. The final eleventh step is to pattern the second conductive layer 50 to form a wiring pattern as shown in FIg. 7K, by using the photo-engraving process, for example.

In fabrication of the semiconductor device shown in FIG. 6, the plasma etching step in the seventh step shown in FIG. 7G is omitted. As shown in FIG. 6, the first conductive layer 76 includes metal layers 72 and 74 superposedly layered. As seen from the foregoing description, the metal layer 74 is used to provide an inclination to the side wall of the remaining portion of the metal layer 72 in the fabrication of the semiconductor device. In the FIG. 6 device, the metal layer 74 is left as it is. However, since the FIG. 6 device needs none of the removing step of the metal layer 74, the process of maunfacturing the device is simplified leading to the cost reduction. The inclination angle $\theta$ of the remaining portion, i.e. the side wall, of the first conductive layer (the metal layers 44, 46 and 48 in FIG. 4 and the metal layer 76 in FIG. 6) to the major surface of the semiconductor body 42 is changeable depending on the kind of the metals of the layers 72 and 74 and the etching means such as etching solution.

Figure 8:
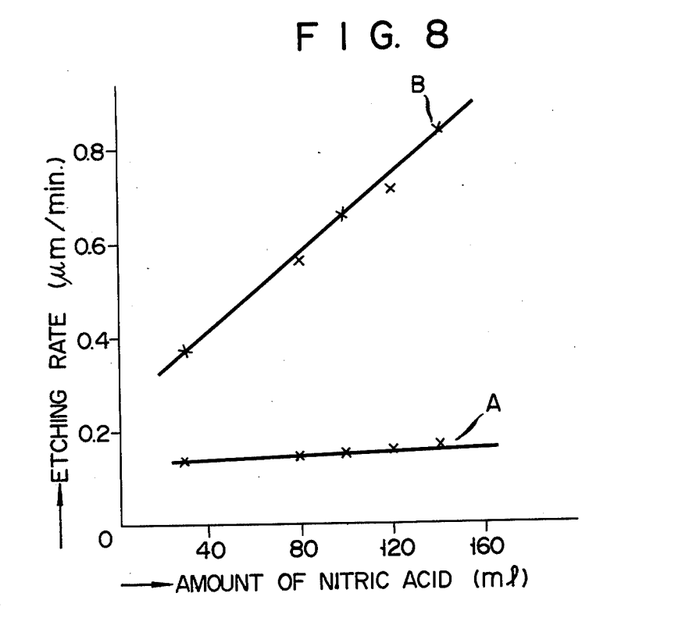
FIG. 8 shows variations of the etching rate of aluminum and molybdenum to the amount of nitric acid having an assay of 70% in the etching solution in which variation curves A and B show the etching rates of aluminum and molybdenum, respectively.

Turning now to FIG. 8, there are shown characteristic curves plotting variations of the etching rates of aluminum and molybdenum to the amount of nitric acid in the etching solution composed of phosphoric acid 760 ml having an assay of 85%, acetic acid 150 ml having an assay of substantially 100%, and nitric acid having an assay of 70% and water 50 ml, respectively. In the figure, a curve A shows the variation of the etching rate of aluminum and another curve B shows that of molybdenum.

As seen from the graph, the etching rate of aluminum is constantly low at about 0.15 $\mu$m/min. with respect to the change of the nitric acid quantity. On the other hand, the etching rate of molybdenum linearly changes with respect to the change of the nitric acid quantity; approx. 0.38 $\mu$m/min. at 35 ml and approx. 0.82 $\mu$m/min. at 130 ml.

In the semiconductor devices shown in FIGS. 4 and 6, a considerably small angle of the inclination angle $\theta$ of the side wall, i.e. the remaining portion, of the first conductive layer to the surface of the first insulating layer 64, reduces the component density per unit area of the semiconductor device. The optimum inclination angle θ at which the integration density is little reduced with no disconnection of the second conductive layer 50, is less than 40°, preferably about 30°.

Figure 9:
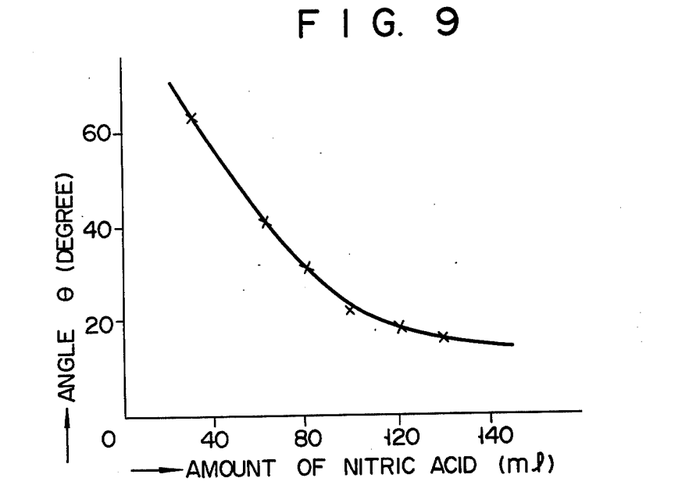
FIG. 9 shows a variation of the inclination angle $\theta$ of a side wall of a laminate comprising aluminum and molybdenum layers to the amount of nitric acid having an assay of 70% in the etching solution.

FIG. 9 shows the relation of the inclination angle θ to the amount of nitric acid havng an assay of 70% in etching solution composed of phosphoric acid having an assay of 85%, acetic acid having an assay of substantially 100%, nitric acid and water. The first conductive layer used is comprised of aluminum and molybdenum layers as in the case described referring to FIGS. 3 to 7. The thickness of the aluminum layer and molybdenum layer are 1 μm and 0.3 μm, respectively. In the etching solution the quantities of phosphoric acid, acetic acid and water are 760 ml, 150 ml and 50 ml, respectively. As seen from the figure, the inclination angle θ decreases as the amount of nitric acid increases, and the optimum inclination angle of approx. 30° is obtained at approximately 80 ml of nitric acid. It will be seen that phosphoric acid, acetic acid, nitric acid and water must be compounded with the ratio of 76:15:8:5 for the optimum compound solution.

Although, in the embodiments heretofore described, only two metal layers of aluminum and molybdenum are used to form the first conductive layer, more than two metal layers may be used for the first conductive layer. In the above-mentioned embodiments, two layers of metalization, i.e. the first and second conductive layers, are used. However, the present invention obviously may involve a greater number of metalization layers.

What we claim is:

1. A process for fabricating a semiconductor device with multi-layered metalizations comprising the steps of:
    preparing a semiconductor body;
    forming on the major surface of said semiconductor body a first insulating layer with first contact holes arranged in a predetermined pattern;
    forming a first metal layer on said first insulating layer, said first metal layer contacting the major surface of said semiconductor body through said first contact holes;
    coating a second metal layer onto said first metal layer, said first metal layer having a lower etching rate than the etching rate of said second metal layer, said first and second metal layuers constituting a first conductive member;
    forming a mask layer with a predetermined pattern on said first conductive member;
    combining into a single etching means suitable etchants for each of said first metal layer and said second metal layer in concentrations selected from a wide range of useable and workable alternative combinations;
    etching said first conductive member by etching means and by using said mask layer as a mask to remove unnecessary portions thereof so that said first conductive member has the side wall portions diverged to widen toward said semiconductor body;
    removing said mask layer;
    forming on said first conductive member a second insulating layer with second contact holes in a predetermined pattern;
    forming a second conductive member including at least one metal layer on said second insulating layer, said second conductive member contacting with said first conductive member through said second contact holes.

2. A process according to claim 1, further comprising the step of removing said second metal layer, after the step of removing said mask layer.

3. A process according to claim 2, in which said removing step of said second metal layers is performed by using plasma-etching method.

4. A process according to claim 1, in which said first and second conductive members are formed by evaporation method.

5. A process according to claim 1, in which said first and second conductive members are formed by sputtering method.

6. A process according to claim 1, in which said second conductive member includes at least third and fourth metal layers, said third metal layer being layered on said second insulating layer and said fourth metal layer being layered on said third metal layer, the etching rate of said third metal layer being lower than that of said fourth metal layer.

7. A process according to claim 6, further comprising the step of removing said fourth metal layer of said second conductive layer.

8. A process according to claim 5, in which said removing step of said second conductive member is performed by plasma-etching method.

9. A process according to claim 1, in which said masking layer is a photoresist.

10. A process according to claim 1, in which said an etching means is etching solution.

11. A process according to claim 1, in which said first metal layer is made of aluminum, said second metal layer is made of molybdenum, and said etching means is a compound solution composed of phosphoric acid, acetic acid, nitric acid and water.

12. A process for fabricating a semiconductor device with multi-layered metalizations comprising the steps of:
    preparing a semiconductor body;
    forming on the major surfaces of said semiconductor body a first insulating layer with first contact holes arranged in a predetermined pattern;
    forming a first metal layer on said first insulating layer, said first metal layer contacting the major surface of said semiconductor body through said first contact holes;
    coating a second metal layer onto said first metal layer, said first metal layer having a lower etching rate than the etching rate of said second metal layer, said first and second metal layers constituting a first conductive member;
    forming a mask layer with a predetermined pattern on said first conductive member;
    combining into a single etching means suitable etchants for each of said first metal layer and said second metal layer, in concentrations selected from a wide range of useable and workable alternative combinations;
    etching said first conductive member by said etching means and by using said mask layer as a mask to remove unnecessary portions thereof so that said first conductive member has the sidewall portions diverged to widen toward said semiconductor body;
    removing said mask layer;
    removing said second metal layer;
    forming on said first metal layer a second insulating layer with second contact holes in a predetermined pattern; and
    forming a second conductive member including at least one metal layer on said second insulating layer, said second conductive member contacting with said first metal layer through said second contact holes.

* * * * *